United States Patent [19]

Adam

[11] Patent Number: 4,511,881
[45] Date of Patent: Apr. 16, 1985

[54] INTEGRATED VOLTAGE DIVIDER WITH SELECTION CIRCUIT

[75] Inventor: Fritz G. Adam, Freiburg, Fed. Rep. of Germany

[73] Assignee: ITT Industries, Inc., New York, N.Y.

[21] Appl. No.: 373,819

[22] Filed: Apr. 30, 1982

[30] Foreign Application Priority Data

May 16, 1981 [EP] European Pat. Off. ........ 81103764.7

[51] Int. Cl.³ .................... H03K 13/02; H03K 13/03
[52] U.S. Cl. ...................... 340/347 DA; 340/347 M
[58] Field of Search .... 340/347 M, 347 DA, 347 CC, 340/347 C

[56] References Cited

U.S. PATENT DOCUMENTS 4,354,175 10/1982 Goldstein .................. 340/347 M X

FOREIGN PATENT DOCUMENTS 2029658 3/1980 United Kingdom .

Primary Examiner—T. J. Sloyan
Attorney, Agent, or Firm—James B. Raden; Edward J. Brosius

[57] ABSTRACT

An integrated voltage divider is provided having a series arrangement of resistors. Each tapping point between resistors is connected to the output by a switching circuit comprised of transistors. A selection circuit comprising an open circuit decoder and a short circuit decoder is connected to individual gates of the switching transistors to selectively operate such switching transistors.

7 Claims, 9 Drawing Figures

FIG. 2
| A | L | L | L | L | L | L | L | L | H | H | H | H | H | H | H | H |
|---|---|---|---|---|---|---|---|---|---|---|---|---|---|---|---|---|
| B | L | L | L | L | H | H | H | H | L | L | L | L | H | H | H | H |
| C | L | L | H | H | L | L | H | H | L | L | H | H | L | L | H | H |
| D | L | H | L | H | L | H | L | H | L | H | L | H | L | H | L | H |
|   | 0 | 1 | 2 | 3 | 4 | 5 | 6 | 7 | 8 | 9 | 10 | 11 | 12 | 13 | 14 | 15 |
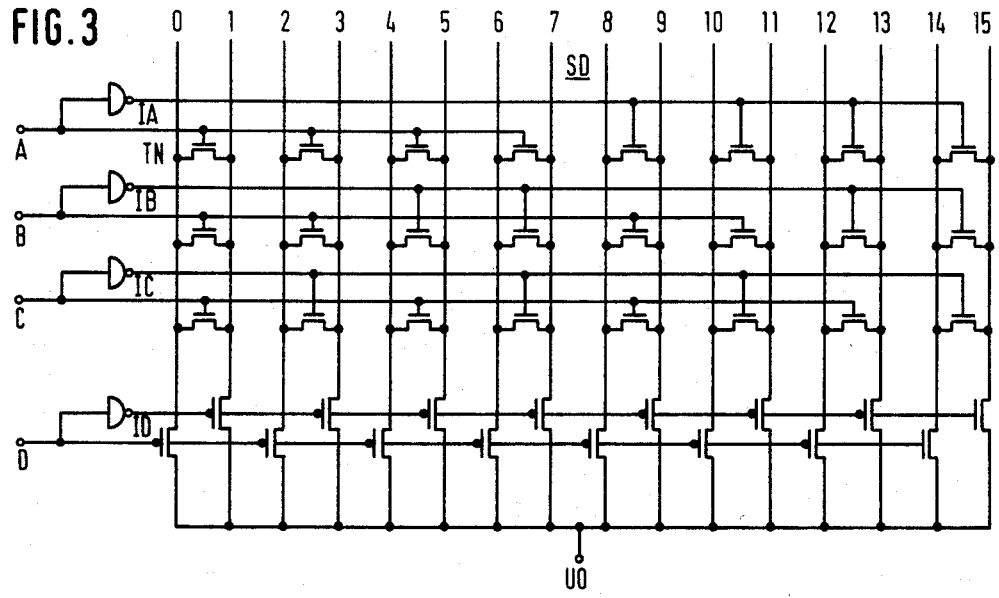
FIG. 3
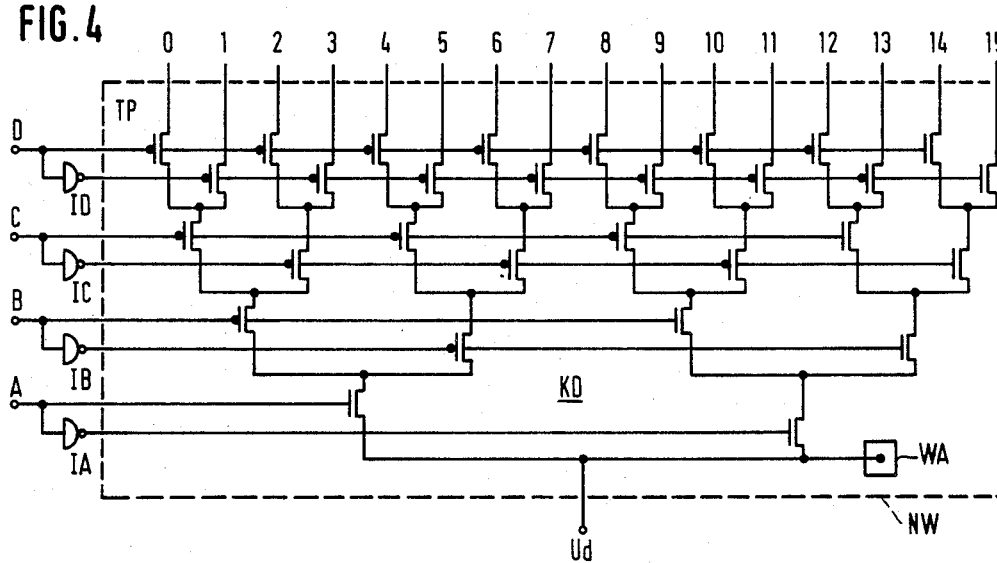
FIG. 4

INTEGRATED VOLTAGE DIVIDER WITH SELECTION CIRCUIT

BACKGROUND OF THE INVENTION

The invention relates to an integrated voltage divider consisting of the series arrangement of a number of resistors operated from a biasing voltage, whose tapping points are capable of being connected through via switching connections by means of a selection circuit to the voltage output, with the selection circuit, the resistors and the switching connections all being materialized in the insulated-gate field-effect transistor technique.

One such integrated voltage divider has been disclosed in DE-OS No. 29 30 375, claim 1, FIGS. 3 and 8. As the switching connections in this voltage divider there are used series arrangements of transistors of one uniform conductivity type, but of a different control type, i.e., enhancement type as well as depletion type transistors. The depletion type transistors are therein arranged at those points of the semiconductor body where two conductor leads cross each other, i.e., they serve as so-called tunnels.

For the examples of embodiment shown in the aforementioned FIGS. 3 and 8, employing eight resistors and one three-bit selecting signal, there is applied to the respective voltage divider tapping points, the series arrangement of the switching sections of up to eight transistors so that either, as in the case of FIG. 3, there is still added to the voltage-dividing resistors the internal resistance of these series arrangements or else, as in the case of FIG. 8, the series resistance to be taken into consideration, increases from tapping point to tapping point. The internal resistance of the voltage divider as seen from the voltage output, is accordingly composed of the actual voltage-dividing resistances and of the equivalent resistances of the individual series arrangements. The voltage output, however, shall be in connection with the voltage divider tapping points in a low-ohmic as possible manner which, however, is very difficult to obtain with the aid of the conventional arrangements.

Here, the invention is supposed to provide a remedy which, in the way as characterized in the claims, solves the problem of designing an integrated voltage divider of such a type, in such a way that between each voltage divider tapping point and the voltage output there will occur, if possible, the same resistance value, and that the selection circuit can be operated with a low as possible quiescent current.

Owing to the separation of the switching function from the selecting function as is provided for according to the invention, which two functions are combined in the series arrangements of the conventional circuits, it is possible to solve the given problem. In the course of this, there results the further advantage that far lower requirements have to be placed on the accuracy of the resistance values of the voltage divider than in the case of voltage dividers operating on the R−2R principle. This property is substantially secured by the fact that the switching connections between the voltage divider tapping points and the voltage output are materialized each time only by a single switching section or, in cases where transmission gates are used, by two parallel-arranged transistor switching sections.

The invention will now be explained in greater detail with reference to FIGS. 1 to 9 of the accompanying drawings, in which:

BRIEF DESCRIPTION OF THE DRAWINGS

FIG. 3 shows the circuit diagram relating to an open-circuit decoder capable of being employed with the invention, and which is activated by a selecting signal according to FIG. 2, FIG. 4 shows the circuit diagram relating to a short-circuit decoder capable of being employed with the invention, for a selecting signal according to FIG. 2.

DETAILED DESCRIPTION OF THE INVENTION

Figure 1:
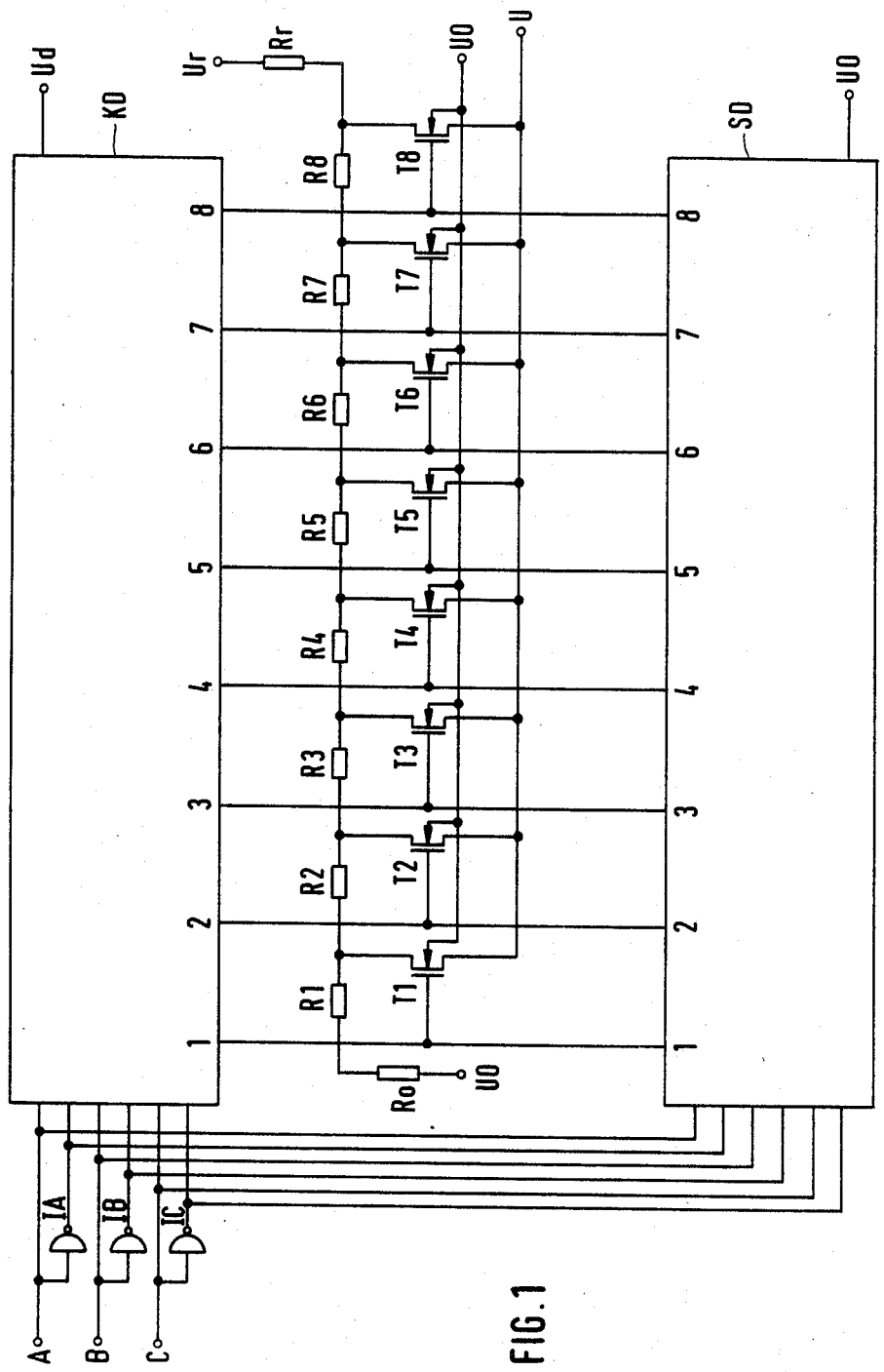
FIG. 1 partly shows the schematic circuit diagram relating to one example of embodiment of the invention for eight tapping points and a three-bit selecting signal, FIG. 2, in a tabular way, shows the allocation of the sixteen states of a four-bit naturally binary encoded selecting signal.

FIG. 1 partly shows the schematical circuit diagram relating to one example of embodiment of the invention for a voltage divider provided with eight tapping points, consisting of the resistors R0, R1 . . . R8, Rr which, in this particular order of succession, are arranged between the reference potential UO of the source of biasing voltage Ur and the voltage-conducting pole thereof. The resistor R0 may randomly also be omitted. The points connecting the respective neighboring resistors R1 . . . R8 forming the eight tapping points, are each connected via the switching section of the switching transistors T1 . . . T8 to the voltage output U. Each tapping point is connected via one single such switching transistor to the voltage output U. The switching transistors are all of the same channel-conductivity type, hence in FIG. 1 these are n-channel transistors whose substrate is applied to the reference potential UO of the source of reference voltage Ur. The potential range from UO up to the potential at the highest tapping point between the transistors R8 and Rr, in this particular example of embodiment, can only extend over one part of the biasing voltage range. If the potential at the highest tapping point is supposed to correspond to Ur, then the resistor Rr must be omitted.

For controlling the gates of the switching transistors and, consequently, for connecting through the corresponding tapping point potential to the voltage output U there is used the selection circuit consisting of the 1-ex-n-short-circuit decoder KD and of the 1-ex-n-open-circuit decoder SD, with like inputs of the two decoders being connected in parallel and supplied with the corresponding bits A, B, C of the selecting signal. In the same way, like outputs 1 . . . 8 of the two decoders KD, SD are connected with one another and each time serve to activate the gate of the associated transistor indicated by the same reference numeral; the outputs 1 are thus applied e.g. to the gate of the transistor T1.

The generally required feeding of the inputs of the two decoders KD, SD with the direct, as well as also with the inverted bits A, B, C of the selecting signal is denoted in FIG. 1 by the preinverters IA, IB, IC. The open circuit decoder SD consists exclusively of transistors of the one channel-conductivity type, hence in FIG. 1 of n-channel transistors which are all arranged in the semiconductor body of the integrated voltage divider as connected to the reference potential UO of the source of biasing voltage Ur, with the potential input of the open-circuit decoder SD likewise being connected to this reference potential UO.

In distinction thereto, the short-circuit decoder KD consists exclusively of transistors of the other channel-conductivity type, hence in FIG. 1 of p-channel transistors which are arranged within a separate insulating island (NW in FIG. 4) of the one channel-conductivity type, and its potential input is connected to this insulating island and to the operating voltage Ud. Owing to the parallel selection on the address side and the parallel arrangement of the outputs 1 ... 8 of the two decoders there results altogether a CMOS-inverter-like interconnection which exactly has the properties thereof as regards the quiescent current consumption.

The table in FIG. 2 shows the states of a four-bit naturally-binary encoded selecting signal A ... D, as can be used for selecting the decoders shown in FIGS. 3 and 4.

Thus, FIG. 3 shows the circuit diagram relating to an open-circuit decoder SD which is capable of being selected by this four-bit selecting signal A ... D, with this decoder SD being exclusively composed of n-channel transistors TN. The functionally characteristical feature of this open-circuit decoder is to be seen in that all possible connecting lines between the reference potential UO and the addressed output, are interrupted or blocked, whereas to the non-addressed outputs each time at least one connecting line is connected through. The technical layout of the circuit of the open-circuit decoder SD according to FIG. 3 can be described in such a way that to the least significant bit D of the selecting signal there is associated each time one of the 16 series transistors belonging to the 16 outputs, which are arranged between the reference potential UO and the corresponding output. These series transistors are alternately selected either by the selecting signal bit D directly, or else via the pre-inverter ID. The two outputs of such a pair of series transistors are then connected with one another via three shunt transistors allotted to the remaining three bits and which, in accordance with FIG. 3, are selected either directly or via the corresponding pre-inverter, by the corresponding selecting-signal bit A, B, C.

For example, referring to FIGS. 2 and 3, if the output 7 is selected, A would be a low or off signal, and B, C and D would be high or on. Tracing appropriate transistors of FIG. 3 and applying the appropriate signals low A, high B, C and D, to turn on or off appropriate transistors, only output 7 is not connected to reference voltage UO. All other outputs are possible due to connection of adjoining outputs such as 0, 1, or by blocking due to the turning on of the transistors receiving the D high signal.

FIG. 4 shows the circuit diagram of the corresponding short-circuit decoder KD which is exclusively materialized with p-channel transistors TP. All of these p-channel transistors TP are arranged in the n-conducting insulating island NW of the semiconductor body which, in turn, is connected via the contact WA, to the operating voltage Ud. The functionally characteristical feature of the short-circuit decoder KD is to be seen in that all connecting lines extending between the operating voltage Ud and the non-addressed decoder outputs are interrupted by *one* blocked transistor, while the connecting line extending between the addressed output line and the operating voltage Ud is connected through with the aid of the series-arranged transistors. The technical layout of the circuit might be described in such a way that, by starting out from the transistor pair associated with the most significant signal bit A and having their source electrodes connected to the operating voltage Ud, the layout is branched in a tree-like manner towards the least significant signal bit in respectively two branches. Relative thereto, two transistors which are connected together with their source electrodes are selected by the corresponding signal bit either directly or via the pre-inverter.

For example, referring to FIGS. 2 and 4, if the output 7 is selected, A would be a low or off signal, and B, C and D would be high or on. Tracing appropriate transistors of FIG. 4 and applying the appropriate signals low A, high B, C and D, to turn on or off appropriate transistors, only output 7 is connected to operating voltage Ud. For example, outputs 8–15 are not possible due to the high signal for B, C and D.

Accordingly, owing to the parallel arrangement on the output side of the two decoders according to FIGS. 3 and 4 there will result for each connecting line associated with one address, and extending between the reference potential UO and the operating voltage Ud, the behavior corresponding to that of a simple CMOS inverter, i.e., in such a way that the respective addressed output assumes the potential of the short-circuit decoder substrate while all non-addressed outputs assume the potential of the open-circuit decoder substrate.

Figure 5:
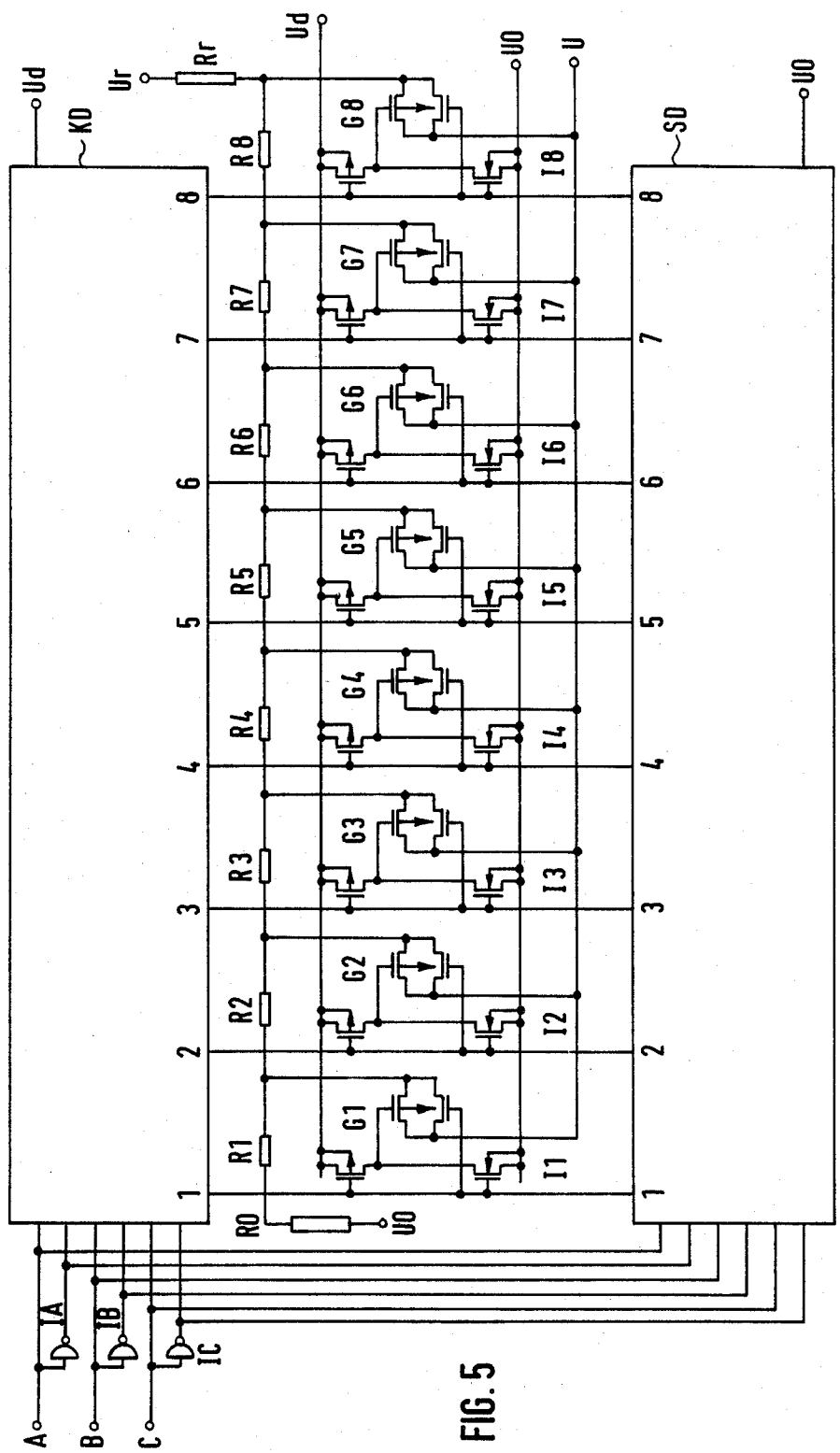
FIG. 5 shows a modification of the arrangement according to FIG. 1 for being operated at higher references voltages.

If the integrated voltage divider according to the invention is to be realized completely in accordance with the CMOS technique, the switching transistors T . . . according to FIG. 1 may be replaced by CMOS transmission gates with associated CMOS inverters. FIG. 5 shows a corresponding example of embodiment relating to the three-bit selecting signal as in FIG. 1. Instead of the switching transistors T1 ... T8 as shown therein, there are provided the transmission gates G1 ... G8, with the switching sections thereof each lying between the respectively associated voltage divider tapping point and the voltage output U.

The one control inputs of the transmission gates G1 ... G8 are connected directly to the associated parallel arranged outputs of the two decoders SD, KD while the other control inputs, via the corresponding CMOS inverters I1 ... I8 are connected to these outputs. In the case of the polarity as chosen for the respective example of embodiment as shown in FIG. 5, relating to the switching transistors of the two decoders SD, KD which is the same as in the example of embodiment shown in FIG. 1 and in FIGS. 3 and 4 (open-circuit decoder SD with n-channel transistors TN, short-circuit decoder KD with p-channel transistors TP), the gate of the n-channel transistors of the transmission gates is selected directly, and the gate of the p-channel transistors is selected via the CMOS inverters.

Figure 9:
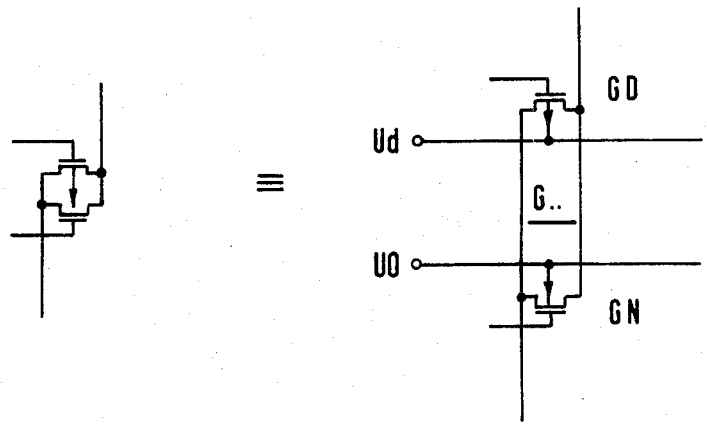
FIG. 9 shows the arrangement of the substrate of the transmission gates according to FIG. 5.

FIG. 9 shows to what potential the substrate of the transmission gate transistors is to be connected, i.e, the substrate of the p-channel transistor GP to the operating voltage Ud, and that of the n-channel transistor GN to the reference potential UO of the source of biasing voltage Ur. Moreover, in the same way also the respective substrate of the CMOS inverter transistors is connected to either the operating voltage Ud or the reference voltage UO, between which two potentials there is also arranged the switching section of the CMOS inverters.

By completely designing the integrated voltage divider in accordance with the known CMOS technique as shown in FIG. 5, there results the possibility and, accordingly, also the advantage of being able to operate with a higher biasing voltage $Ur \leq Ud$, so that along the voltage divider there will result greater potential steps which facilitate the semiconductor-technical realization of the voltage divider, with a view to the tolerance conditions. In particular, as the biasing voltage Ur there may now be also chosen the full operating voltage Ud, and the resistor Rr may then be omitted.

For the complete and rapid through connection of the partial voltages at the voltage-divider tapping points, the operating voltage Ud should at least be equal to the sum of the amounts of the threshold voltage of the p-channel transistors, the threshold voltage of the n-channel transistors and the effective gate-source voltage of the transistors.

Figure 6:
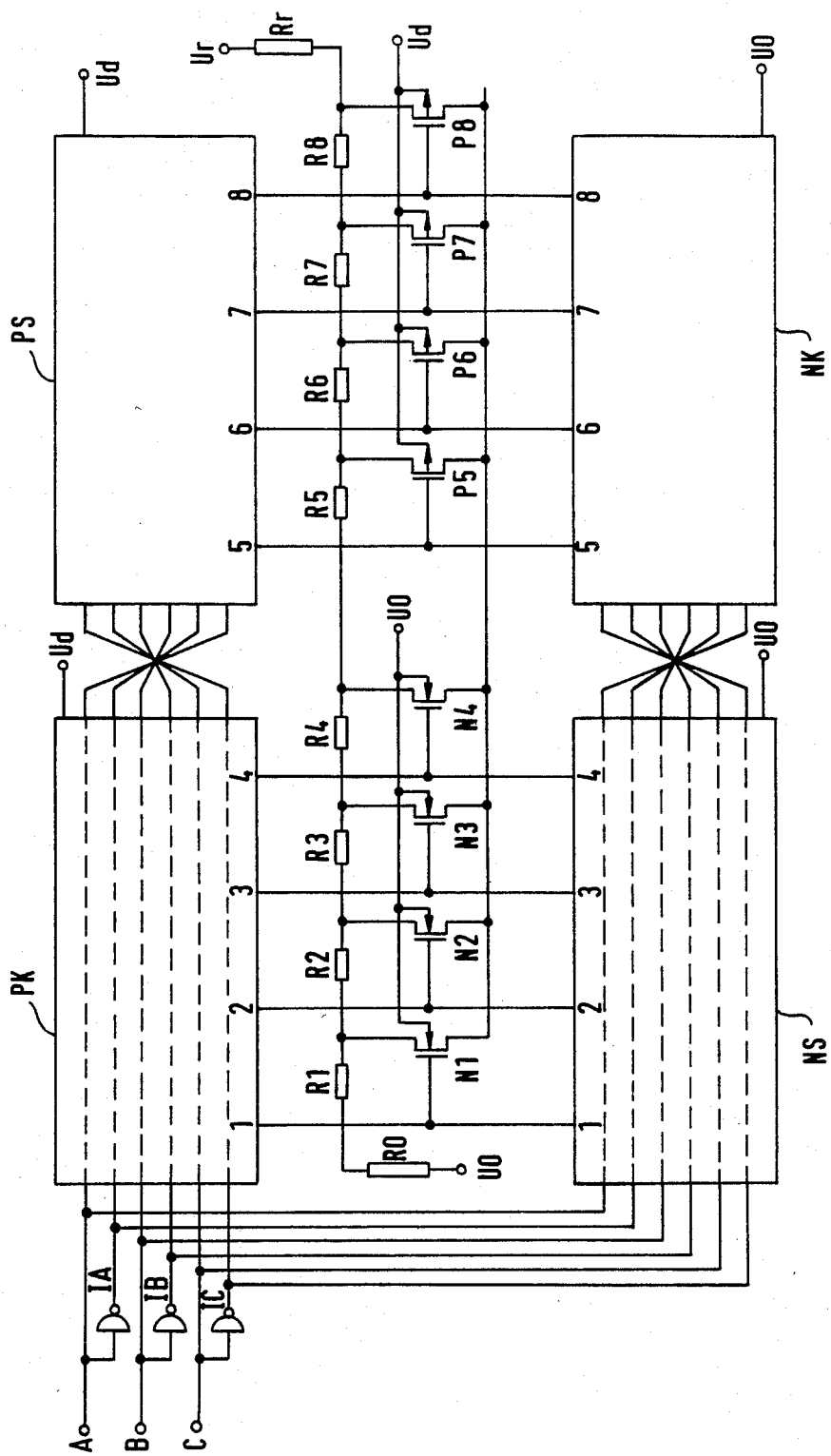
FIG. 6 shows one further embodiment of the arrangement according to FIG. 5.
Figure 7:
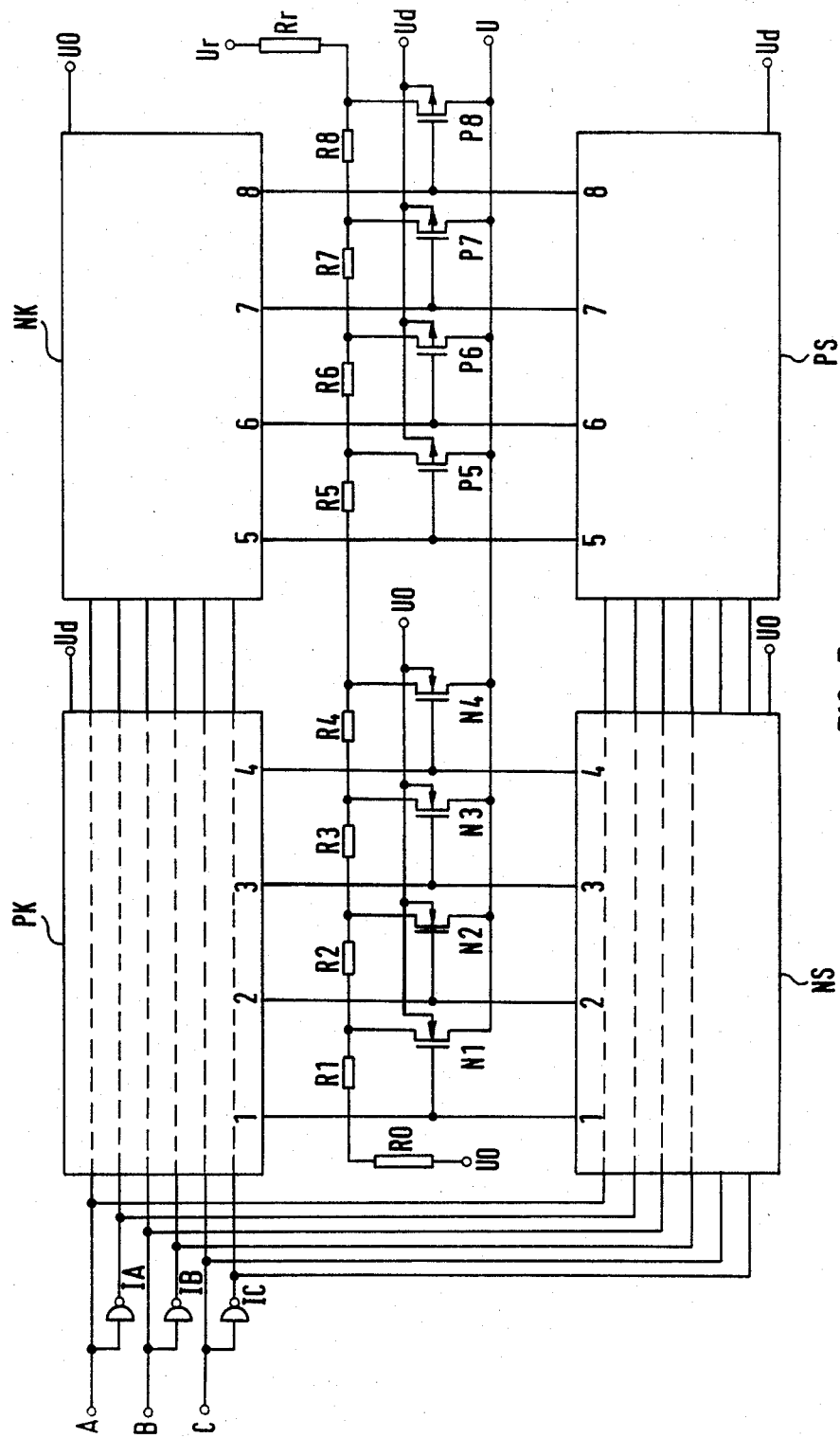
FIG. 7 shows one further embodiment of the arrangement according to FIG. 6.

Compared with the types of embodiment shown in FIG. 1, the modified type of embodiment as shown in FIG. 5 employs practically three times the amount of transistors. If this investment, especially with respect to voltage dividers with a larger number of tapping points, should appear to be no longer acceptable, it is possible, by maintaining the complete CMOS principle, to reduce this investment, as is shown in FIGS. 6 and 7. In fact, for the rapid and complete through-connection of the tapping voltages it is sufficient for the partial voltages which are negative with respect to the center tapping point, to be connected through with the aid of n-channel switching transistors, and for the partial voltages which are positive with respect to the center tapping point, to be connected through with the aid of p-channel switching transistors to the voltage output U. Relative thereto, and with respect to the example of embodiment according to FIG. 6, it is assumed that the operating voltage Ud and the biasing voltage Ur are positive voltages. Accordingly, in FIG. 6 there are provided the four n-channel switching transistors N1 . . . N4 whose substrate is connected to the reference potential UO and which perform the through connection of the partial voltages at the tapping points belonging to the resistors R1 . . . R4. The tapping points belonging to the resistors R5 . . . R8 are associated with the p-channel switching transistors P5 . . . P8, with the substrate thereof being connected to the operating voltage Ud.

In FIG. 6, compared with the examples of embodiment according to FIGS. 1 and 5, the following modifications still have to be carried out. The part of the open-circuit decoder associated with the positive partial voltages, is replaced by the n-channel short-circuit partial decoder NK whose potential input is connected to the reference potential UO and whose transistors are arranged in the semiconductor body of the integrated voltage divider. The part of the short-circuit decoder associated with the positive partial voltages, is replaced by the p-channel open-circuit partial decoder PS whose potential input is connected to the operating voltage Ud and whose transistors are arranged in one single insulating island which is connected to the operating voltage Ud.

The inputs of the partial decoders NK, PS are connected in the inverted order of sequence to the corresponding inputs of the remaining n-channel open-circuit partial decoder NS or of the remaining p-channel short-circuit partial decoder PK. The potential input of the n-channel open-circuit partial decoder NS is connected to the reference potential UO and its transistors are arranged in the semiconductor body, while the potential input of the p-channel short-circuit partial decoder PK is connected to the operating voltage Ud and its transistors are arranged in an insulating island of their own, of the semiconductor body. For the sake of clarity of the graphical representation of FIG. 6 (and likewise of FIG. 7), the input line is continued in the circuit symbols of the partial decoders NS, PK in the form of dashlines extending from the left to the right. By the splitting into the aforementioned partial decoders it is accomplished that there will be obtained the output signal necessary for selecting the p-channel switching transistors P5 . . . P8.

Since the crossing conductor leads in the example of embodiment according to FIG. 6 likewise cause an additional surface requirement in the integrated circuit, it is possible according to FIG. 7 and by way of a different assignment, to return again to non-crossing conductor leads. This becomes possible in that, when compared with FIG. 6, the positions of the partial decoders NK, PS are interchanged, so that above the voltage divider there are arranged the short-circuit partial decoders and, below the voltage divider there are arranged the open-circuit partial decoders, of course each realized by employing transitors of the opposite channel conductivity type. Accordingly, above the voltage divider there are arranged the p-channel short-circuit partial decoder PK and the n-channel short-circuit partial decoder NK, and below there are arranged the n-channel open-circuit partial decoder NS and the p-channel open-circuit partial decoder PS. The partial decoders NK, PS which are associated with the positive partial voltages, and belonging to the open-circuit or the short-circuit decoder respectively, thus each time consist of transistors of that particular channel conductivity type which is in opposition to the channel conductivity type of the partial decoders NS, PK associated with the negative partial voltages.

Whereas prior to the changing of positions, on both sides of the voltage divider there are each time arranged decoders of the same channel conductivity type, with the partial decoders of one side capable of being accommodated in a common, throughgoing insulating island, there will be arranged after the changing of positions, on each side of the resistance chain, each time two partial decoders of a different channel conductivity type, with such ones of the same conductivity types being positioned diagonally opposite each other. By taking this measure it is possible for the aforementioned additional surface area as required by the crossing lines according to FIG. 6, to be reduced to a small remaining additional surface area, i.e., to so much surface area as is needed for one insulating island boundary region between each time two partial decoders.

The integrated voltage dividers according to the invention are preferably suitable for use with digital-to-analog converters. If the converter is supposed to have a linear characteristic, the resistors of the voltage divider will have to be provided with like resistance values, and in the case of non-linear converter characteristics correspondingly different resistance values will have to be provided for. In cases where the digital-to-analog converter is supposed to produce from a naturally binary encoded binary signal, a corresponding voltage, the voltage divider will appropriately have at least $N=2^n$ equally dimensioned resistors. Moreover, the voltage output U is to be connected to the input of a voltage amplifier, and an RC smoothing circuit is to be arranged subsequently thereto.

Figure 8:
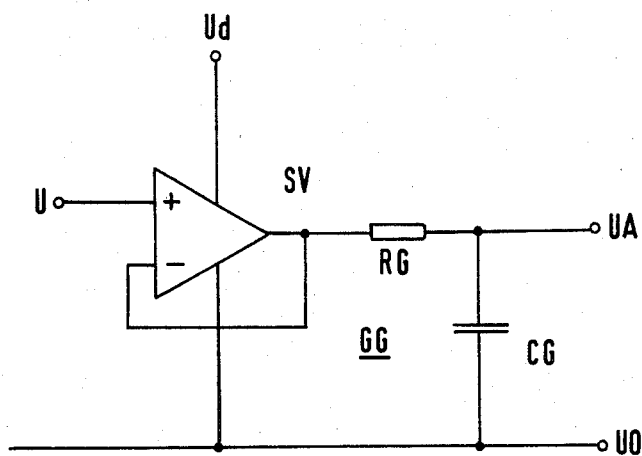
FIG. 8 shows the circuit of the voltage output with an amplifier in a voltage-follower circuit, and with a smoothing element relating to the case where the invention is used as a digital-to-analog converter.

With respect to the case of a digital-to-analog converter employing an arrangement according to examples of embodiment as shown in FIGS. 5 to 7, it is possible to use a voltage amplifier with a gain 1, hence a so-called voltage follower. This additional wiring of the voltage output U of the integrated voltage divider according to the invention is schematically shown in FIG. 8, illustrating the voltage amplifier SV shown therein as an operational amplifier (op amp) voltage-follower, as well as the smoothing circuit GG consisting of the resistor RG and of the capacitor CG, at the output of which the analog output voltage UA can be taken off.

I claim:

1. An integrated voltage divider comprising a series arrangement of a number (N) of resistors operated from a biasing voltage (Ur), with the tapping points thereof each, via a switching connection comprising one individual switching transistor or a series arrangement of switching transistors and dependent upon a digital selecting signal, capable of being connected through to the voltage output (U) by means of a selection circuit, with said selection circuit, said resistors (R . . . ) and said switching connections employing transistors of the insulated-gate field-effect type, wherein each switching connection is realized by the switching section of one single switching transistor of the one selected channel conductivity type;

a selection circuit comprising short circuit decoder (KD) and an open circuit decoder (SD) the corresponding inputs of which are arranged in parallel and supplied with the corresponding bits of the selecting signal;

said open-circuit decoder (SD) comprising transistors of one selected channel conductivity type which are arranged in the semiconductor body of the integrated voltage divider as connected to a reference potential (UO) of the source of voltage (Ur), the potential input of the open circuit decoder connected to the reference potential (UO);

said short-circuit decoder (KD) comprising transistors of the other channel conductivity type, which are arranged within a separate insulating island (NW) of the one selected channel conductivity type, the potential input of the short circuit decoder connected to this insulating island (NW) and to the operating voltage (Ud), wherein like outputs of both the open-circuit and the short-circuit decoders (SD, KD) are connected to one another and to the respective gates of the switching transistors (T . . . ), such that upon the supply of the bits of the selecting signal, the appropriate sections of the switching transistors are turned on to permit the desired output voltage.

2. A modification of the voltage divider as claimed in claim 1, wherein the switching connections are designed as CMOS transmission gates the one control inputs of which are connected directly to the like outputs of both the open-circuit and the short-circuit decoders (SD, KD), and the other control inputs of which are each connected via a CMOS inverter to the like outputs.

3. A voltage divider as claimed in claim 1 wherein said open-circuit decoder (SD) comprises only n-channel transistors, and that said short-circuit decoder (KD) comprises only p-channel transistors.

4. A voltage divider as claimed in claim 1, wherein
the switching transistors which, with respect to the center tapping point, belong to negative partial voltages, are n-channel transistors and the switching transistors which, with respect to the center tapping point, belong to positive partial voltages, are p-channel transistors; and the part of the open-circuit decoder associated with the positive partial voltages, is replaced by an n-channel short-circuit partial decoder (NK) and the part of the short-circuit decoder associated with the positive partial voltages, is replaced by a p-channel open-circuit partial decoder (PS) whose respective inputs, in an inverted order of succession, are connected to the corresponding inputs of either the remaining n-channel open-circuit partial decoder (NS) or the remaining p-channel short-circuit partial decoder (PK).

5. A voltage divider as claimed in claim 1 wherein
the switching transistors which, with respect to the center tapping point, belong to negative partial voltages, are n-channel transistors and the switching transistors which, with respect to the center tapping point, belong to positive partial voltages, are p-channel transistors;

the partial decoder of the open-circuit decoder, associated with the positive partial voltages, consists of p-channel transistors, and the partial decoder of the open-circuit decoder associated with the negative partial voltages, consists of n-channel transistors; and in the short-circuit decoder, the channel conductivity types of the partial decoders, with respect to the partial voltages, are associated exactly inversely than those in the open-circuit decoder.

6. An integrated circuit comprising a series arrangement of at least $N=2^n$ equally dimensioned resistors operated from a biasing voltage (Ur), with the tapping points thereof each, via a switching connection comprising one individual switching transistor or a series arrangement of switching transistors and dependent upon a natural bit binary selecting signal, capable of being connected through to the voltage output (U) by means of a selection circuit, with said selection circuit, said resistors (R . . . ) and said switching connections employing transistors of the insulated-gate field-effect type, wherein each switching connection is realized by the switching section of one single switching transistor of the one selected channel conductivity type;

a selection circuit comprising short circuit decoder (KD) and an open circuit decoder (SD) the corresponding inputs of which are arranged parallel and supplied with the corresponding bits of the selecting signal;

said open-circuit decoder (SD) comprising transistors of one selected channel conductivity type which are arranged in the semiconductor body of the integrated voltage divider as connected to a reference potential (UO) of the source of voltage (Ur), the potential input of the open circuit decoder connected to the reference potential (UO);

said short-circuit decoder (KD) comprising transistors of the other channel conductivity type, which are arranged within a separate insulating island (NW) of the one selected channel conductivity type, the potential input of the short circuit decoder connected to this insulating island (NW) and to the operating voltage (Ud), wherein like outputs of both the open-circuit and the short-circuit decoders (SD, KD) are connected to one another and to the respective gates of the switching transistors (T...), such that upon the supply of the selecting signal, the appropriate sections of the switching transistors are turned on to permit the desired output voltage, and the output voltage is connected to the input of a voltage amplifier (SV) whose output is provided with a resistor capacitor smoothing circuit (GG), whereby said integrated circuit operates as a digital-to-analog converter.

7. A digital-to-analog converter as claimed in claim 6, wherein said voltage amplifier has a gain of 1.

* * * * *